United States Patent [19]
Palmer et al.

[11] Patent Number: 4,813,589
[45] Date of Patent: Mar. 21, 1989

[54] SURFACE MOUNTED DEVICE REWORK HEAT GUIDE

[76] Inventors: Harold D. Palmer, 970 Pulpit Rock Circle N., Colorado Springs, Colo. 80918; Daren D. Palmer, 8065 Essington Dr., Colorado Springs, Colo. 80920; Thomas P. Mealey, 8 Woodsorrel, Pueblo, Colo. 80101

[21] Appl. No.: 178,030

[22] Filed: Apr. 5, 1988

[51] Int. Cl.$^4$ .......................... B23K 31/00; B23K 1/12
[52] U.S. Cl. ...................................... 228/119; 228/264
[58] Field of Search ................ 228/6.2, 222, 264, 119, 228/242, 20 HD, 20 R

[56] References Cited

U.S. PATENT DOCUMENTS

| | | | |
|---|---|---|---|
| 3,172,382 | 3/1965 | Weglin | 113/59 |
| 3,557,430 | 1/1971 | Jones | 29/203 |
| 3,731,866 | 5/1973 | Mason et al. | 29/762 |
| 3,910,479 | 10/1975 | Kohler | 228/20 HT |
| 4,066,204 | 1/1978 | Wirbser et al. | 228/264 |
| 4,318,504 | 2/1982 | Rauchwerger | 228/20 HT |
| 4,366,925 | 1/1983 | Fanene | 228/20 |
| 4,426,571 | 1/1984 | Beck | 219/373 |
| 4,528,746 | 7/1985 | Yoshimura | 29/743 |
| 4,552,300 | 11/1985 | Zovko et al. | 228/20 |
| 4,564,135 | 1/1986 | Barresi et al. | 228/6.2 |
| 4,569,473 | 2/1986 | Guiliano | 228/264 |
| 4,605,152 | 8/1986 | Fridman | 228/6.2 |
| 4,626,205 | 12/1986 | Barkley et al. | 432/225 |
| 4,750,664 | 6/1988 | Furtek | 228/20 |

*Primary Examiner*—Nicholas P. Godici
*Assistant Examiner*—Michael William Starkweather
*Attorney, Agent, or Firm*—Linda Flewellen Gould

[57] ABSTRACT

Leaded and leadless surface mounted devices are removed from or attached to a printed circuit board at various locations, without interfering with or adversely affecting other chips on the printed circuit board. The method of removal involves placing a tool on the substrate, comprising a rigid plate containing a hole, and a hollow tube extending beneath the hole from the rigid plate to the substrate. In this way a surface mounted device to be removed may be surrounded completely by the hollow tube, without encompassing adjacent chips. When heat is directed through the hole in the rigid plate and through the hollow tube to the surface mounted device, the soldered connections attaching the surface mounted device to the board may be melted. A disconnecting means is utilized to remove the surface mounted device from the substrate at the moment the soldered connections are melted or, in the case of non-eutectic solder, changed to a plastic phase. The same tool may be used to facilitate the attachment of a surface mounted device to a printed circuit board, by applying hot gas to the component to be attached, through the hollow tube surrounding that component, as solder is applied to form a plurality of soldered connections.

7 Claims, 3 Drawing Sheets

SURFACE MOUNTED DEVICE REWORK HEAT GUIDE

BACKGROUND OF THE INVENTION

1. Technical Field

This invention pertains to the removal and attachment of surface mounted devices, such as integrated circuit chips, with respect to printed circuit boards. Surface mounted devices are usually connected to ne face or side of the printed circuit board by soldered connections. Although some chips are connected to boards by connections going through holes in the board, surface mounted devices are connected by solder attached only to the face of the substrate on which the surface mounted device lies. The soldered connections may attach a plurality of sides of the surface mounted device to the board. In fact, typical surface mounted devices are attached to a printed circuit board by soldered connections on each of the four sides of the rectangular surface mounted device. On the other hand, many of the leadless surface mounted devices are attached by soldered connections under the device, rather than on its sides.

Numerous situations may result in a need for removing a surface mounted device which has been soldered to a printed circuit board. The chip may have been erroneously attached in an incorrect position on the substrate. In other cases, the surface mounted device may cease to function, so that a new chip must be substituted for the old one.

1. Background Art

Much of modern industry is dependent on properly functioning printed circuit boards. When a board is incorrectly assembled, or when a chip needs to be replaced, soldered connections must be cleanly broken to allow the incorrectly placed or disfunctioning chip to be removed. A tool for removing malfunctioning chips would be most useful if it was portable and compact enough to be used at the location of equipment containing the malfunctioning chip.

Soldered connections may be individually desoldered by means of a tool, such as a soldering iron, which is placed in contact with the connection to apply heat. Heat may be so applied to raise the soldered connection to its melting point, in the case of eutectic solder. Similarly, the temperature of non-eutectic solder may be raised until the solder assumes a plastic phase. In either case, the connection may harden anew when the solder between the chip and the board is allowed to return to room temperature. Thus, a chip attached to a board by soldered connections may be removed only if all of the soldered connections holding it in place are heated simultaneously to the melting point or plastic phase as the case may be.

A tool designed to desolder by applying heat to individual connections is described in U.S. Pat. No. 3,172,382 to Weglin. Heat is conductively applied to each connection, and a hand manipulated bulb is used to remove loosened solder by applying suction through a metal tube. Although this tool effectively desolders single soldered connections, it is not an effective device for desoldering surface mounted devices, which are held in place by multiple soldered connections, all of which must be broken at once.

Complicated devices have been designed to direct heat to all sides of a surface mounted device, so as to heat each connection at the same time. One such device is shown in U.S. Pat. No. 4,366,925 to Fanene. A hot gas source is used to direct heat onto the component to be removed, while a needle inserted at the base of the component is used to force the component upwards. The device is bulky and complicated. Adjacent surface mounted parts may interfere with placement of the needle, and the needle may injure the surface mounted device.

Similarly, U.S. Pat. No. 4,552,300 to Zovko, et al. describes a method and apparatus for applying heat to a chip, which is then removed by means of a vacuum device. The mechanism is so large and bulky that the suction head, when lowered into contact with the chip to be removed may mechanically interfere with adjacent chips on a circuit board containing multiple densely mounted components.

The Fanene and Zovko patents share additional problems. As hot gas is used to increase the temperature of the soldered connections on the chip to be removed, that hot gas may flow to adjacent chips on the substrate, possibly causing connections on these near-by chips to become desoldered.

Various mechanisms have been utilized to avoid the detrimental effects of hot air flowing to soldered connections of chips adjacent to the surface mounted device being removed. U.S. Pat. No. 4,626,205 to Barkley et al. discusses an apparatus which directs a heated fluid to the connections of a chip to increase temperature. This heated fluid ma be directed through a nozzle structure to the edges of the surface mounted device being removed, without increasing the temperature of adjacent soldered connections. However, chips positioned close to the surface mounted device to be removed may mechanically prevent the fluid containing nozzle from being lowered onto that surface mounted device. Additionally, the bulk of this machine makes it impossible to transport it from its dedicated location.

Similarly, a heat source is applied conductively to the soldered connections of a chip to be removed in the devices described in U.S. Pat. No. 4,528,746 to Yoshimura and in U.S. Pat. No. 4,066,204 to Wirbser et al. Such a conductive heat source has the disadvantage that it is impossible to determine the exact moment in which the soldered connections are sufficiently heated to reach the melting point or plastic phase, thus resulting in the continued application o heat in excess of that needed to remove the chip. Such excessive heat may adversely affect the surface mounted device, and the substrate to which it is connected. Although the Wirbser device heats the entire chip, and thus may eventually sufficiently increase the temperature of solder under the chip to facilitate removal of leadless surface mounted devices, this lengthy heating of the chip itself may adversely affect the chip, and the board on which it is mounted.

Other methods of overcoming the problem of allowing hot air to leak to adjacent components have been attempted. U.S. Pat. No. 4,605,152 to Fridman discusses a device for delivering heated air to a surface mounted device, which is removed by means of a vacuum. The hot air is directed to the chip to be removed through a nozzle structure. Similarly, U.S. Pat. No. 4,426,571 to Beck describes an electric hot air tool utilizing differing size nozzles to direct the hot air onto the chip to be desoldered. The size and complexity of these apparatuses are detrimental. A circuit board from which a chip is to be removed must be taken to the dedicated location in which the apparatus resides. Taking the Fridman or Beck device to the location of the circuit board is virtually prohibited by their size and cost.

U.S. Pat. No. 4,564,135 to Barresi et al. describes a nozzle-type structure for heating the soldered connections of a surface mounted device, while inhibiting the directed hot air from heating either adjacent chips or the surface mounted device being removed. The interior design of the Barresi nozzle does surpass the nozzle designs described in Fridman and Beck, by preventing hot air from increasing the temperature of the chip being removed. The device may still result in needless and detrimental heat being applied to the removed chip, however. Since there is no way to know when the soldered connections have been completely melted, the user of the Barresi apparatus is likely to apply heat to the chip being removed for a longer period of time than is necessary for removal, thus causing damage to the substrate to which it is attached. The chip is not automatically removed from the board when the soldered connection reaches a molten state.

Other chip desoldering devices known in the prior art are described in U.S. Pat. No. 4,569,473 to Guiliano and U.S. Pat. No. 3,557,430 to Jones. These devices effectively remove chips which are connected to the printed circuit board by soldered connections that go through holes to the underside of the board, rather than residing on the surface. Although these inventions are effective for their intended purpose, they do not establish a device or method of removing surface mounted devices.

The devices described in the Zovko, Fridman, Barresi, Barkley and Bech patents may also be utilized to apply heat to a surface mounted device for the purpose of heating solder on all sides of the chip to form soldered connections with the substrate adjacent to the component. The bulkiness of these devices, and in some cases the flow of hot air onto adjacent components, results in the same adverse consequences as the use of these devices for desoldering.

Although devices are known in the prior art which effectively remove surface mounted devices from the printed circuit boards to which they are attached and in some cases facilitate soldering a surface mounted device to a substrate, these devices share certain detrimental aspects. The size and bulkiness of most of the known apparatuses for removing surface mounted devices have two draw-backs: (1) the apparatuses must be kept in a dedicated location, and are not easily transported to the location of the surface mounted device to be removed, and (2) the printed circuit board and chips adjacent to the surface mounted device to be removed are subjected to adverse heat or physical interference. Furthermore, the surface mounted device being removed or attached is disadvantageously affected by the application of extraneous heat, since the surface mounted device is not shielded from the application of heat, or is not removed from the board and the heat applier until some time after the soldered connections have been melted or secured.

DISCLOSURE OF THE INVENTION

Summary of the Invention

An object of this invention is to provide a simple, inexpensive component attachment and removal apparatus which may be transported to the cite of the printed circuit board. The tool described will economically and simply effectuate the removal of leaded and leadless surface mounted components, including SOIC packages, gull wing formed flat packs, and close pitch leaded quad packs. The same tool may be utilized to facilitate soldering of a chip onto the printed circuit board.

Another object of this invention is to provide a method of attaching or removing surface mounted devices which efficiently melts solder to form soldered connections, or melts the soldered connections of a surface mounted device being removed, without adversely affecting the substrate, adjacent chips, or the chip to be attached or removed by undue heating.

The surface mounted device rework heat guide of this invention utilizes a simple, portable small tool to direct hot gas to the edges of a surface mounted device, to facilitate the removal or attachment of that device with respect to a printed circuit board.

The tool utilized in this method of removing or connecting surface mounted devices comprises a plate, with a hole in the flat surface of the plate. A hollow tube extends perpendicularly from the lower surface of the plate, adjacent to the hole. The plate and tube may be advantageously composed of metal, polymers, ceramic material, or any composite which is rigid and able to withstand high temperatures. The end of the tube opposite the plate is fittable over the surface mounted device to be removed or attached, and adjacent to the printed circuit board from which the device is to be removed or to which it is to be connected.

The size and shape of the opening in the hollow tube which surrounds the surface mounted device, and the length of that tube, can be varied to accommodate a plurality of sizes and shapes of surface mounted devices. Each tool will be designed to completely surround a particular size chip, together with the soldered connections by which that chip is attached to the board, without extending so far as to encompass or touch other components of the printed circuit board.

The tube allows hot air to be directed from an external heat source to the component to be connected or removed, without permitting heat to flow to adjacent components. The surface mounted device being removed or attached is not unduly heated either, as a suction cup assembly or other shield is attachable to the top of the chip, protecting it from the hot gas.

An automatic means for removing a chip from the board to which it is attached is provided by means of a suction cup, vacuum tube, and vacuum source arrangement. By applying a separating spring loaded force to the removal mechanism during the time hot air is applied to the chip, the chip is pulled from the board as soon as the soldered connections have been desoldered. In this way, the invention allows the hot gas to be discontinued as soon the chip is unsoldered, without needless application of extraneous heat which might damage the surface mounted device, or the substrate to which it is attached.

Additional advantages of this invention will become apparent from the description which follows, taken in conjunction with the accompanying drawings.

DETAILED DESCRIPTION OF THE PREFERRED EMBODIMENT

Figure 1:
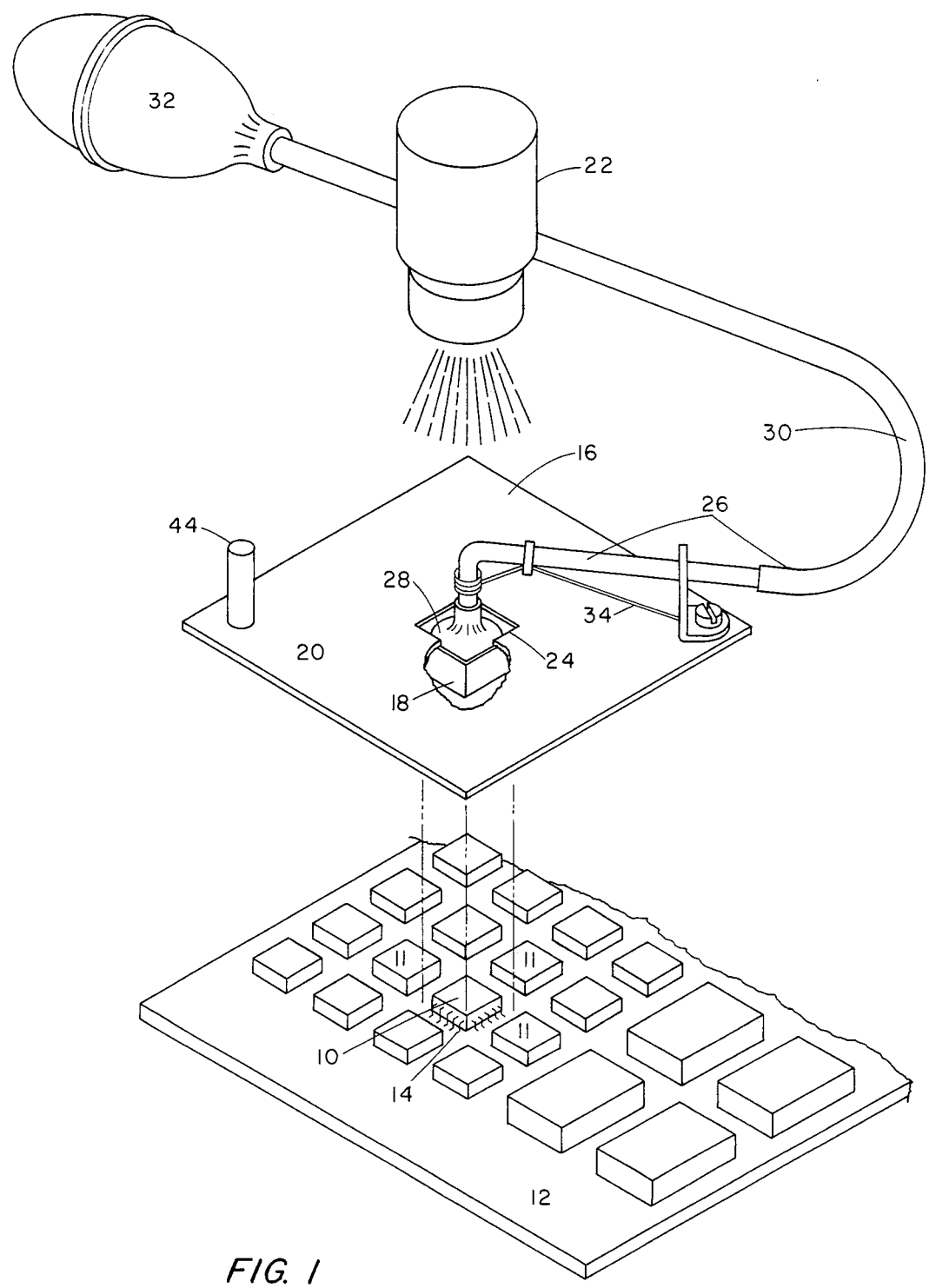
FIG. 1 is a perspective view of a tool being lowered onto a printed circuit board into a position in which a surface mounted device may be soldered to the board or removed by use of the tool.

The features of the surface mounted device rework technique according to the present invention can be better understood by reference to FIG. 1. As is shown in FIG. 1, a surface mounted device 10 is attached to a substrate 12 by a plurality of soldered connections 14. The surface mounted device 10 may be attached to the printed circuit board 12 by leadless soldered connections, placed between the surface mounted device 10 and the printed circuit board 12. Although the invention described herein advantageously removes surface mounted devices attached by either type of soldered connection, only leaded soldered connections 14 attached to the side of the surface mounted device 10 are shown on the accompanying drawings.

As shown in FIG. 1, other surface mounted devices 11 are attached to the printed circuit board 12 in close proximity to the surface mounted device 10. The present invention allows the removal of the surface mounted device 10 without removing or detrimentally affecting the adjacent surface mounted devices 11.

In order to remove the surface mounted device in accordance with the present invention, a specially designed plate 16 is positioned above the printed circuit board 12 in such a manner that a hollow tube 18 extending from the lower face (not shown) of the flat surface 20 of the plate 16 to completely surround the surface mounted device 10 and the soldered connections 14 by which it is attached to the substrate 12. The plate and tube may be composed of metal, polymers, ceramics, or any composite which is rigid and able to withstand high temperatures.

As shown in FIG. 1, hot gas is applied to the soldered connections 14 from a heat source 22, which is directed through a hole 24 in the flat surface 20 of the plate 16. A disconnecting means 26 is used to pull the surface mounted device 10 from the printed circuit board 12 when the soldered connections 14 are melted.

Figure 3:
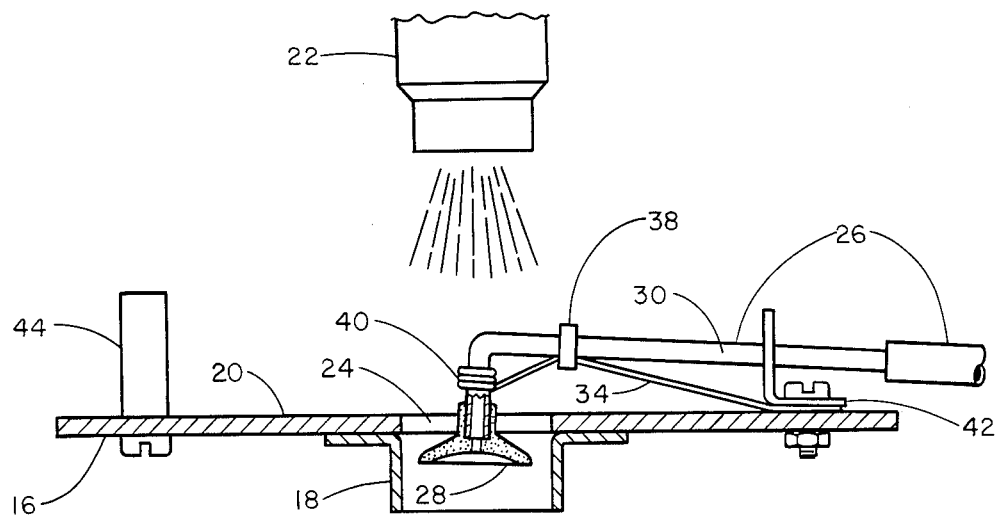
FIG. 3 is a side view of a tool which can be used to attach or remove a surface mounted device with respect to a printed circuit board.

The size and shape of the tube 18 may be varied. The dimensions of the opening of the tube which surrounds the surface mounted device 10 should be large enough to fully encompass that surface mounted device and any soldered connections holding it to the printed circuit board 12, while small enough that hot gas will not be directed to adjacent surface mounted devices 11. In this manner, the tube 18 acts as a shield to prevent hot gas from leaking to those adjacent surface mounted devices 11. Multiple plate designs may be effectuated, to accommodate the heating and removal of surface mounted devices of a large variety of sizes and shapes. The opening of the tube 18 which is adjacent to the lower face of the plate 16 may be wider than or smaller than the opposite opening surrounding the surface mounted device 10. As shown in FIG. 3, the opening at each end of the tube 18 may be the same shape and size, as well. In either case, the opening of the tube 18 which is adjacent to the lower face of the plate 16 will be of the same dimensions as the hole 24 in the plate 16.

Figure 2:
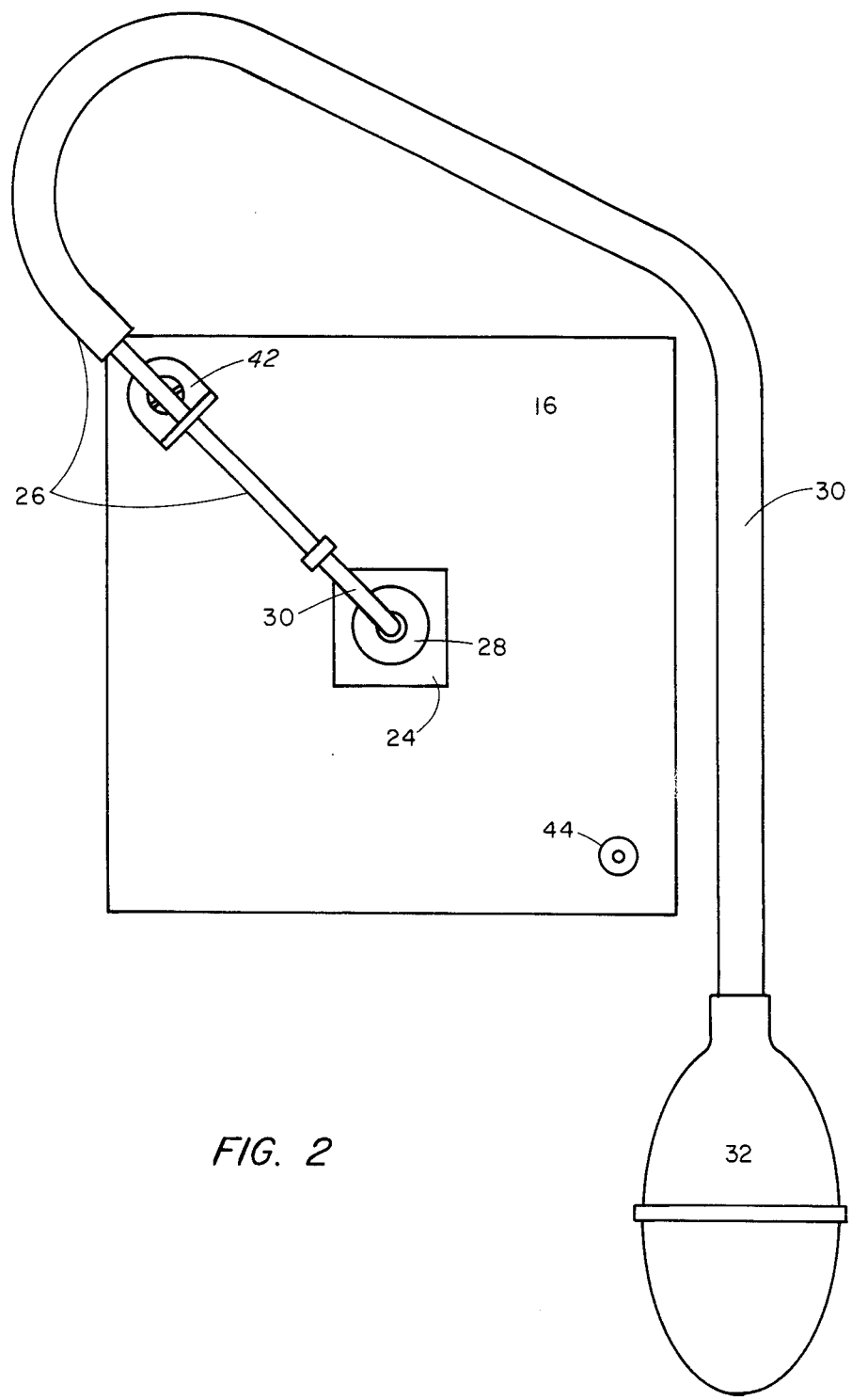
FIG. 2 is a top view of a tool which can be utilized to attach or remove a surface mounted device with respect to a printed circuit board, but does not show the heating means which constitutes a part of that tool.

As shown in FIG. 2 and FIG. 3, the disconnecting means 26 may include a suction cup 28 attached to one end of a vacuum tube 30. A vacuum source is attachable to the end of the vacuum tube 30 which is opposite the suction cup 28. Such vacuum source may be a hand operated rubber bulb 32. Although the hand operated rubber bulb provides simplicity and ease of transport, other methods of creating a vacuum through the vacuum tube 30 may be substituted.

When the plate 16 is placed onto the printed circuit board 12, as shown in FIG. 1, so that the tube 18 surrounds the surface mounted device 10 the suction cup 28 may be placed on top of the surface mounted device 10. The vacuum tube 30 may then run through the tube 18 and the hole 24 to the vacuum source 32, as shown in FIG. 2. The suction cup 28 is thus attachable to the surface mounted device 10 by the creation of a vacuum by means of the vacuum source 32.

Although other means of grasping the surface mounted device 10 are possible, the use of a suction cup 28 formed of rubber or another elastomeric polymer has several advantages. The placement of a suction cup on top of the surface mounted device 10 acts as a shield of the hot gas which will be directed through the tube 18 and onto the surface mounted device 10 from the heat source 22. This shield limits the disadvantageous effects which might result from the application of hot gas directly to the surface mounted device 10. At the same time, hot gas may exhaust upwards through the tube 18 with little hindrance, as might be caused by a grasping mechanism of greater bulk. Furthermore, a suction cup of rubber or other elastomeric polymer does not cause mechanical damage to the surface mounted device 10, as might result from other grasping mechanisms.

As shown in FIG. 3, a spring mechanism 34 may be used to provide an automatic separating force, pushing the vacuum tube 30 away from the plate 16. As the vacuum tube 30 is pushed away from the plate 16, the suction cup 28 attached to the vacuum tube 30 is also subjected to the separating force, resulting in the lifting of the suction cup 28 relative to the plate 16. In this manner, force is applied to move the suction cup 28 through the tube 18 toward the hole 24. As a result, the surface mounted device 10 is lifted with the suction cup 28 attached to it, and is separated from the substrate 12 as soon as the soldered connections 14 are melted which held the surface mounted device 10 to the printed circuit board 12.

Other mechanisms may be utilized to provide the separating force by which the surface mounted device 10 is lifted from the printed circuit board 12. The spring mechanism 34 shown in FIG. 3 is designed to provide such a separating force, by attaching a wire or other spring 34 to the vacuum tube with an attachment 38. The wire 34 is attachable to the upper face of the flat surface 20 by a screw and plate 42, or other method of attachment. The coil 40 of the spring may be wrapped around the vacuum tube 30 at such a point that the coil provides an upwards force, pushing the vacuum tube 30 away from the upper face of the flat surface 20 of the plate 16.

Figure 4:
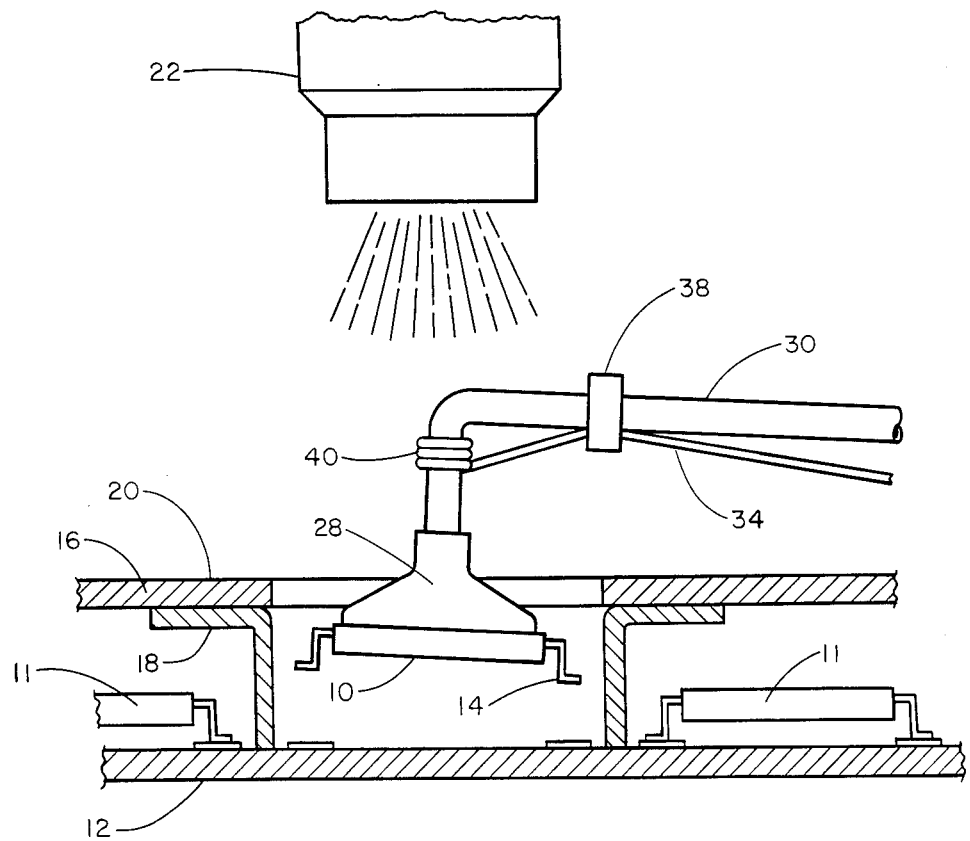
FIG. 4 is a view of a surface mounted device being pulled away from a printed circuit board, using the technique described herein.

As shown in FIG. 4, as a result of the separating force created by the spring mechanism 34, the suction cup 28 and the surface mounted device 10 to which the suction cup is attached are raised at the same moment that the soldered connections 14 are melted, or reach a plastic phase in the case of non-eutectic solder. Once the surface mounted device 10 is seen to rise from the printed circuit board 12, the operator of this surface mounted device rework technique may remove the plate 16 from the printed circuit board 12. A handle 44 made of rubber, wood, or other thermally insulating material may be advantageously attached to the flat surface 20 of the plate 16 to facilitate removal of the plate 16 from the printed circuit board 12.

The surface mounted device 10 may be released from the suction cup 28 by releasing the vacuum created by the vacuum source 32, allowing the surface mounted device to be conveniently deposited on a table or work area.

The rework heat guide may be advantageously used in the process of attaching a surface mounted device 10 to the printed circuit board 12, possibly to replace a recently removed chip that had ceased to function properly The surface mounted device 10 to be soldered is placed on the board 12 in the appropriate position. The plate 16 is then lowered onto the substrate 12, so that the chip 10 is surrounded by the tube 18. Although the disconnecting means 26 is not used, and no vacuum is created, the suction cup 28 may be used to provide a shielding effect for the top of the surface mounted device 10 from the hot gas administered through the tube 18

Hot gas is provided from a heat source 22, while solder is applied to each side of the surface mounted device 10. As a result, soldered connections 14 are formed on all sides of the surface mounted device 10, with no interference to adjacent chips 11. Once the solder reaches a temperature appropriate to the formation of soldered connections, the hot gas is discontinued. The plate 16 is then lifted from the substrate 12, leaving the properly attached surface mounted device 10.

The invention has been described in detail with particular reference to preferred embodiments thereof. As will be apparent to those skilled in the art in the light of the accompanying disclosure, many alterations, substitutions, modifications, and variations are possible in the practice of the invention without departing from the spirit and scope of the invention.

We claim:

1. A tool for removing a surface mounted device from a substrate to which the surface mounted device is attached by a plurality of solder connections, comprising:
   (a) a rigid plate with upper and lower faces, having a hole formed therein from which an elongated hollow tube extends to a bottom end of the hollow tube having a size and shape allowing the hollow tube to completely surround the surface mounted device and the plurality of solder connections when the bottom end of the hollow tube is placed in contact with the substrate,
   (b) heater means located above said plate for directing hot gas through the hole in the rigid plate and through the hollow tube to the surface mounted device and the plurality of solder connections, to melt the solder connections, and
   (c) disconnecting means attached to the top of said plate for removing the surface mounted device from the substrate through said hollow tube when the solder connections are melted.

2. A tool as described in claim 1, wherein said disconnecting means comprises:
   (a) a suction cup, attachable to the surface mounted device,
   (b) an elongated vacuum tube attached at one end to the suction cup, extending from the suction cup through the hollow tube and through the hole in the rigid plate, and
   (c) a vacuum source, attached to the other end of the vacuum tube.

3. A tool as described in claim 2, wherein said disconnecting means further comprises a spring device attached between the upper face of the rigid plate and the vacuum tube, the spring device applying a separating force to the vacuum tube and the rigid plate to move the vacuum tube away from the rigid plate, and raise the attached suction cup and any surface mounted device attached to the suction cup, when the solder connections connecting the surface mounted device to the substrate have been melted, or reach a plastic phase in the case of non-eutectic solder.

4. A tool as described in claim 1, wherein a handle is attached to the upper face of the rigid plate to allow the tool to be lifted from the substrate, said handle being made of a heat insulating material.

5. A method of removing a surface mounted device from a substrate to which the surface mounted device is attached by a plurality of solder connections, comprising the steps of:
   (a) placing in contact with the substrate a tool comprising a rigid plate with upper and lower faces having a hole formed therein from which an elongated hollow tube extends in such a position that the bottom end of the hollow tube completely surrounds the surface mounted device and the plurality of solder connections,
   (b) directing hot gas from above said plate through the hole in the rigid plate and through the hollow tube to the surface mounted device and the plurality of solder connections, causing the solder connections to melt, and
   (c) removing the surface mounted device from the substrate through said hollow tube when the solder connections are melted.

6. A method of removing a surface mounted device from a substrate as described in claim 5, further comprising:
   (a) attaching a suction cup to the surface mounted device, by applying a vacuum to the suction cup, and
   (b) applying pressure to the suction cup to force the suction cup, and the attached surface mounted device, away from the substrate, when the soldered connections have been melted.

7. A method of attaching a surface mounted device in a particular position on a substrate by a plurality of soldered connection, comprising the steps of:
   (a) applying solder to the surface mounted device or to the substrate,
   (b) placing the surface mounted device in contact with the substrate in the position,
   (c) placing in contact with the substrate a tool comprising a rigid plate with upper and lower faces having a hole formed therein from an elongated hollow tube extends in such a position that the bottom end of the hollow tube completely surrounds the surface mounted device,
   (d) directing hot gas from above said plate through the hole in the rigid plate and through the hollow tube to the surface mounted device, and
   (e) removing the rigid plate from the substrate at a time when the solder has been sufficiently heated so that soldered connections between the surface mounted device and the substrate will form.

* * * * *